United States Patent
Cook et al.

(10) Patent No.: US 8,669,041 B2
(45) Date of Patent: *Mar. 11, 2014

(54) METHOD FOR IMPROVING PRINT PERFORMANCE OF FLEXOGRAPHIC PRINTING ELEMENTS

(76) Inventors: Brian Cook, Roswell, GA (US); David A. Recchia, Smyrna, GA (US); Timothy Gotsick, Acworth, GA (US)

( * ) Notice: Subject to any disclaimer, the term of this patent is extended or adjusted under 35 U.S.C. 154(b) by 152 days.

This patent is subject to a terminal disclaimer.

(21) Appl. No.: 13/183,558

(22) Filed: Jul. 15, 2011

(65) Prior Publication Data

US 2013/0017493 A1   Jan. 17, 2013

(51) Int. Cl.
  *G03F 7/00*   (2006.01)
  *G03F 7/26*   (2006.01)
  *B41N 1/00*   (2006.01)

(52) U.S. Cl.
  USPC ............ 430/306; 430/270.1; 430/271.1; 430/273.1; 430/296; 101/453

(58) Field of Classification Search
  USPC .................................................. 430/306
  See application file for complete search history.

(56) References Cited

U.S. PATENT DOCUMENTS

| | | |
|---|---|---|
| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 5,135,827 A | 8/1992 | Bohm et al. |
| 5,223,375 A | 6/1993 | Berrier et al. |
| 5,262,275 A * | 11/1993 | Fan .......................... 430/273.1 |
| 5,892,588 A | 4/1999 | Samworth |
| 5,925,500 A | 7/1999 | Yang |
| 6,238,837 B1 | 5/2001 | Fan |
| 6,492,095 B2 | 12/2002 | Samworth |
| 6,731,405 B2 | 5/2004 | Samworth |
| 7,580,154 B2 * | 8/2009 | Samworth .................. 358/3.06 |
| 7,682,775 B2 | 3/2010 | Rapp et al. |
| 7,827,911 B2 | 11/2010 | Kettinger et al. |
| 2011/0079158 A1 | 4/2011 | Recchia |
| 2011/0081614 A1 * | 4/2011 | Recchia .................... 430/306 |

FOREIGN PATENT DOCUMENTS

| | | | |
|---|---|---|---|
| EP | 0 456 336 | 11/1991 | |
| EP | 0 640 878 | 3/1995 | |
| GB | 1 366 769 | 9/1974 | |
| WO | WO 2009033124 A2 * | 3/2009 | ............ G03F 7/20 |

* cited by examiner

*Primary Examiner* — Chanceity Robinson
(74) *Attorney, Agent, or Firm* — Carmody Torrance Sandak & Hennesey LLP

(57) ABSTRACT

A method of making a relief image printing element having a relief pattern comprising a plurality of relief dots, wherein the photocurable printing blank comprises a backing layer having at least one photocurable layer disposed thereon and a masking layer on the at least one photocurable layer is provided. The method comprising the steps of: a) selectively ablating the masking layer to create an overall image in the masking layer, such that the overall image comprises a sub-image, comprising a pattern of cells, in it; b) applying an oxygen barrier layer on top of the masking layer; c) exposing the printing element to actinic radiation through the oxygen barrier layer and the masking layer; and d) developing the printing blank by removing the barrier layer and the uncured portions of the photocurable layer to reveal the relief image.

14 Claims, No Drawings

METHOD FOR IMPROVING PRINT PERFORMANCE OF FLEXOGRAPHIC PRINTING ELEMENTS

FIELD OF THE INVENTION

The present invention relates generally to methods for improving print performance of relief image printing elements for optimal printing and higher solid ink density.

BACKGROUND OF THE INVENTION

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

Flexography is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Furthermore, due to product competition, the market requirements on the printing quality of the images on the packaging can be very stringent.

A typical flexographic printing plate as delivered by its manufacturer is a multilayered article made of in order, a backing, or support layer; one or more unexposed photocurable layers; optionally a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyelefins, polyamides, and the like. One widely used support layer is a flexible film of polyethylene terephthalate.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may be used.

Photocurable materials generally cross-link (cure) and harden through radical polymerization in at least some actinic wavelength region. As used herein, actinic radiation is radiation capable of polymerizing, crosslinking or curing the photocurable layer. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected, wavelength and power of the laser. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter (i.e., thermal development). Thermal development processes work by processing photopolymer printing plates using heat; the differential melting temperature between cured and uncured photopolymer is used to develop the latent image.

The resulting surface, after development, has a relief pattern that reproduces the image to be printed and which typically includes both solid areas and patterned areas comprising a plurality of relief dots. After the relief image is developed, the relief image printing element may be mounted on a press and printing commenced.

The flexographic printing plate is mounted on a printing cylinder and the material to be printed, which is typically supplied as a continuous web, is placed between the printing roll and a backing roll. The flexographic printing plate is brought against the material with sufficient pressure to allow contact between the relief image on the plate and the material printed. In a typical process, an ink fountain pan supplies ink to a metering roll. A doctor blade may also be used to wipe off excess ink from the metering roll to assist in controlling the amount of ink that is on the metering roll.

In order to produce good images in flexographic printing, it is necessary that the ink be applied to the printed surface in a uniform and predictable manner. This in turn requires that the relief areas in the flexographic plate carry ink in a uniform layer and in predictable amounts.

One means of controlling the amount of ink applied to the printing plate uses a special ink metering roll, known as an "anilox" roll, which has on its surface a plurality of ink metering cells. These cells are small indentations arrayed in regular patterns of a predetermined frequency and of uniform depth and shape which are typically created by engraving the cylinder face using a mechanical process or by laser; the amount of ink delivered by the anilox roll is controlled by the screen size of the cells. During operation, ink is transferred from the ink well onto the anilox metering roll, filling the cells. The optional wiper blade wipes off excess ink from the roll surface leaving only the cells filled. The ink from the cells is then transferred onto the flexographic plate relief areas as the anilox roll and the flexographic plate rotate in contact with one another.

The images typically reproduced by flexographic plates almost always include both solid image areas and a variety of gray tone areas. "Solid areas" are defined as areas completely covered by ink having the highest density the ink can produce on a given material, while "gray areas" are defined as image areas where the appearance of the printed image is of a density intermediate to pure white (total absence of ink) and solid. Gray areas are produced by the half-toning process described herein, in which a plurality of relief surface areas per unit area of progressively larger surface area are used to produce the illusion of different density printing. These relief areas are commonly referred to as "halftone dots."

In addition, flexographic printing is what is known as a "binary system," meaning that it either prints or it does not. When relief areas contact the printed surface, one gets a substantially solid color area. To create a gray scale in flexographic printing, a process called "half-toning" is used, wherein gray tones are reproduced by printing a plurality of minute solid dots per unit area and varying either the frequency of the dots per unit area or the size of the dots per unit area or both.

In a flexographic plate, these halftone dots are relief areas having their surface at the top surface of the plate. The plate in the area surrounding the dot has been etched to a depth which except for the darkest areas reaches to a floor. The height of the halftone dot is the distance of the surface of the dot (and plate surface as well) to the floor, which can be referred to as the "halftone relief." This relief decreases as the % dot coverage increases, and is sufficient to confine ink to the dot surface.

Halftone relief is controlled by a number of factors, including the etching process used to remove the material from between the dots. In a photopolymer flexographic printing plate the maximum relief depth is controlled by a back exposure of the plate which hardens the photopolymer to a desired depth and establishes a floor and thus a maximum relief depth.

In "classic" halftoning, amplitude modulated (AM) screening is used to produce halftone dots in regular repeating patterns of X-number of dots per linear inch. These patterns are identified by the percentage coverage of a given area by the dot surface area within the given areas as 1% dots, 5% dots, 95% dots, 98% dots, etc. A 98% dot means that 98% of a given area is occupied by the dot surface size. A 2% dot means that 2% of the same given area is occupied by the dot surface area therein.

In the alternative, typically referred to a "stochastic" halftoning, frequency modulated (FM) screening is used to increase the frequency of occurrence of the dots to produce higher and higher surface area coverage and the dot size is held constant. In addition, as described in U.S. Pat. No. 5,892,588 to Samworth, the subject matter of which is herein incorporated by reference in its entirety, a combination of the two techniques may be used to improve the visual appearance of the printed image.

The shape of the dots and the depth of the relief, among other factors, affect the quality of the printed image. It is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For AM screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

It is also a known problem in flexographic printing, that solid areas (i.e., areas in the image where there are no half tone dots), appear to print with less saturation and somewhat less uniformity than halftone areas representing dark image areas. Thus an area with a dot coverage of 95% to 98% may appear darker than a solid area (100%), A problem in printing solid areas in flexography is uneven ink transfer over the full solid image area, which can cause a lack of density and a halo effect (i.e., a darker border) along the edges of the solid image area.

The level of color saturation achievable during flexographic printing is dependent upon many factors, prominent among which is the amount and uniformity of ink which can be applied to the print substrate, particularly in solid areas. This is commonly referred to as "Solid Ink Density" (SID). SID is sometimes higher at tone levels less than 100%, e.g., the optical print density achieved at the 97% tone level is slightly higher than that achieved at a 100% (solid) tone.

This observation has led to the development of a number of technologies for introducing fine reverse patterns into the solids of flexographic plates, expressly for the purpose of increasing the achievable SID. Notable examples include DigiCap (available from Kodak) and Groovey Screens (available from Esko-Graphics). DigiCap applies a user definable texture pattern to the surface of a flexographic printing plate to improve ink transfer and the appearance of solid areas, especially when printing on high hold-out substrates such as film or coated paper stocks. Groovy Screens, a hybrid screening technology, uses traditional AM screening throughout most of an image, but adds a line pattern (or "grooves") into the dark, shadow areas and solids. The transition between the normal screen pattern and the line pattern is gradual, leading to a smooth gradation in print between the lower density of the non-groovy print (highlights and midtones) and the higher density (shadows) of the groovy print. Although somewhat effective, these techniques often require considerable experimentation and fine control to achieve consistent success, and can also have negative interactions (e.g., moiré) with the graphic images being printed.

Maintaining small dots on flexographic plates can be very difficult due to the nature of the platemaking process. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore desirable for the dissolved oxygen to be removed from the resin composition before image-wise exposure so that the photocurable resin composition can be more rapidly and uniformly cured and to improve the overall plate structure.

Thus, while various methods have been proposed for improving the quality of the printing plate, there remains a need in the art for additional improvements in the art that can provide a desirable result, especially in improving the achievable solid ink density of flexographic printing elements.

SUMMARY OF THE INVENTION

It is an object of the present invention to provide a method of improving the achievable SID in flexographic relief image printing elements.

It is another object of the present invention to improve ink laydown in flexographic printing elements.

It is another object of the present invention to improve the consistency of the printing results.

It is still another object of the present invention to alleviate problems related to uneven ink transfer over full solid areas and halo effects along the edges of a solid area.

It is another object of the present invention to create a relief image printing element that comprises printing dots having a superior dot structure in terms of print surface, edge definition, shoulder angle, depth and dot height.

To that end, in a preferred embodiment, the present invention relates generally to a method of making a relief image printing element having a relief pattern comprising a plurality of relief dots, Wherein the photocurable printing element comprises a backing layer having at least one photocurable layer disposed thereon and a laser ablatable masking layer on the at least one photocurable layer, the method comprising the steps of:
  a) selectively ablating the masking layer to create an overall image in the masking layer such that the overall image comprises a sub-image, comprising a pattern of cells, in it;
  b) applying an oxygen barrier layer over the masking layer;
  c) exposing the printing element to actinic radiation through the barrier layer and the masking layer to selectively crosslink and cure the at least one photocurable layer, thereby creating the relief image in the printing element; and
  d) developing the printing element by removing the barrier layer and the uncured portions of the photocurable layer to reveal the relief image.

DETAILED DESCRIPTION OF THE INVENTION

As described herein, a problem in printing solid areas in flexography is uneven ink transfer over the full solid area, lack of density and a halo effect along the edges of the solid area.

The inventors have discovered that one of the most critical means of beneficially changing the shape of printing dots formed on a printing element is removing or limiting diffusion of air into the photocurable layer during exposure to actinic radiation by using a barrier membrane. In addition, the inventors of the present invention have also discovered that the use of a sub-image with a pattern to create a textured surface on the photopolymerizable layer, comprising cells, together with limiting the diffusion of air into the photocurable layers using an oxygen barrier membrane, results in substantial improvements in the achievable solid ink density during printing.

In a preferred embodiment, the present invention relates generally to a method of making a relief image printing element having a relief pattern comprising a plurality of relief dots, wherein the photocurable printing element comprises a backing layer having at least one photocurable layer disposed thereon and a laser ablatable masking layer on the at least one photocurable layer, the method comprising the steps of:
  a) selectively ablating the masking layer to create an overall image in the masking layer such that the overall image comprises a sub-image, comprising a pattern of cells, in it;
  b) applying an oxygen barrier layer over the masking layer;
  c) exposing the printing blank to actinic radiation through the barrier layer and the masking layer to selectively crosslink and cure the at least one photocurable thereby creating the relief image in the printing element; and
  d) developing the printing blank by removing the barrier layer and the uncured portions of the photocurable layer to reveal the relief image.

The step of developing the printing blank by removing the barrier layer and the uncured portions of the photocurable layer is typically accomplished by a method selected from the group consisting of water development, solvent development and thermal development. Depending upon the construction of the barrier layer, it is either peeled away or dissolved in the process.

The present invention alleviates the problems of the prior art by improving the ink carrying ability of the solid areas of the flexographic printing plates by providing in that surface a textured surface, which, in a preferred embodiment, comprises a plurality of cells. The sub-image within the overall image creates this texture on the surface of the photopolymerizable layer in a pattern of cells. The process of the present invention also produces halftones, particularly halftones present together with solids, by providing a textured surface comprising cells in selected halftone dots. In one embodiment, at least one of halftone dots has a cell on a surface thereof. One suitable method of making a the textured photocurable surface with cells via the sub-image with a repeating pattern is described for example, in U.S. Pat. No. 7,580,154 to Samworth, the subject matter of which is herein incorporated by reference in its entirety The sub-image which will create the texture and cells on the surface of the photopolymer is created by ablating a pattern into the overall image such that the pattern is on a smaller scale than the overall image features so that the sub-image pattern is fully contained within the overall image features. The sub-image can be present throughout the entire overall image or only portions thereof. The pattern of the sub-image can take a variety of shapes such as circles, polygons or lines. A commercial process which is capable of creating this sub-image with a repeating pattern is sold by Esko Corporation of Ghent, Belgium under the trademark, MICROCELL™.

In generating the cells, care is taken to not to create cells that cut through the edge of a halftone dot. Preferably, the cells are centered in the halftone dots, and are smaller than the halftone dot on which they reside, to avoid creating a cell that extends past an edge of a halftone dot thereby creating scalloped or incomplete halftone dots. Depending on the halftone dot size, more than one cell may be placed thereon. In such case, the cells placed within the halftone dot during the creation of the screen film intermediate may be centered around the dot center.

As the percentage area coverage increases, the dots eventually contact and blend with each other so that after a 50% coverage is reached one no longer has isolated relief areas per dot, but instead isolated holes are observed separating the dots, extending from the surface of the plate toward the floor.

As the dot coverage increases the cells become smaller and smaller and progressively less deep. The depth of the hole is dependent on the dot separation (or the diameter of the hole). Upper limits of flexographic printing plates are 95% dot coverage before plugging of the holes occurs, and possibly even 98% before plugging of the holes occurs. This effect is used in the present invention to create a plurality of shallow cells in the surface of solid and halftone dot areas in a flexographic plate to improve printing quality.

The halftone dot pattern in flexographic plates is of the order of a 100 to 150 lines per inch (lpi) while the cells are arrayed at considerably higher frequencies of 500 to 1000 lpi. The cells appear to behave as anchor points for the ink film on the plate creating an even ink distribution over the solid surface area and then aiding in the uniform transfer of the ink film from the plate to the substrate after impression. Printing of solids is thus very uniform and has good saturation and density, exceeding the saturation and density obtained by the traditional smooth solid printing surface used heretofore.

Furthermore, as set forth herein, the inventors of the present invention have found that removal of dissolved oxygen from photocurable layers may surprisingly also improve imaging fidelity and provide significant improvements in the achievable SID, especially when used in combination with surface patterning techniques described herein.

Exposure under an oxygen barrier membrane has been demonstrated to provide good results, and the most preferred oxygen barrier membranes are clear films that minimize light scattering. These oxygen barrier membranes include materials that are conventionally used as release layers in flexographic printing elements, including polyamides, polyvinyl alcohol, hydroxyalkyl cellulose, polyvinyl pyrrolidinone, copolymers of ethylene and vinyl acetate, amphoteric interpolymers, cellulose acetate butyrate, alkyl cellulose, butyral, cyclic rubbers, and combinations of one or more of the foregoing. In addition, films such as polypropylene, polyethylene, polyvinyl chloride, polyester and similar clear films can also serve well as barrier films. In one preferred embodiment, the barrier membrane comprises a polypropylene film or a polyethylene terephthalate film.

Another type of barrier layer is a liquid or non-oxygen gas barrier in which the printing plate may be covered with a layer of liquid or non oxygen gas, such as a layer of oil, prior to the exposure step, and the oil may be either clear or tinted. The liquid or non-oxygen gas here serves as another form of a barrier layer. As with the solid barrier membrane, it is important that the liquid or non-oxygen gas used be optically transparent to the actinic radiation used to expose the photocurable layer.

Three qualities that the inventors have identified in producing effective barrier layers include optical transparency, low thickness and oxygen transport inhibition. The barrier membrane needs to have a sufficient optical transparency so that the barrier will not detrimentally absorb or deflect the actinic radiation used to expose the photosensitive printing blank. As such it is preferable that the barrier membrane have an optical transparency of at least 50%, most preferably at least 75%. Oxygen transport inhibition is measure in terms of a low oxygen diffusion coefficient. As noted, the oxygen diffusion coefficient of the membrane (or the liquid layer) should be less than $6.9 \times 10^{-9}$ m$^2$/sec., preferably less than $6.9 \times 10^{-10}$ m$^2$/sec, and most preferably less than $6.9 \times 10^{-11}$ m$^2$/sec.

In the case of the oxygen barrier membrane, the barrier membrane thickness should be consistent with the structural needs for handling of the film and the film/photopolymer plate combination. Barrier membrane thicknesses between about 5 and 300 microns are preferred, more preferably between about 10 and about 200, and most preferably between about 1 and 20 microns. The barrier membrane needs to be sufficiently impermeable to oxygen diffusion so that it can effectively limit diffusion of oxygen into the photocurable layer during exposure to actinic radiation. The inventors herein have determined that the barrier membrane materials noted above in the thicknesses noted above will substantially limit the diffusion of oxygen into the photocurable layer when used as described herein.

The barrier layer may be laminated to the surface of the printing plate using pressure and/or heat in a typical lamination process.

In the case of the liquid barrier layer, a liquid layer from 1 μm to 100 μm in thickness comprising any of the following oils will meet the foregoing criteria: paraffinic or naphthenic hydro-carbon oils, silicone oils and vegetable based oils. In a preferred embodiment, the liquid should be spread upon the surface of the printing element before the printing blank is exposed to actinic radiation. The liquid must also be viscous enough to remain in place during processing.

Finally, the relief image printing element is mounted on a printing cylinder of a printing press and printing is commenced.

Another advantage to reducing the impact of oxygen inhibition during plate exposure is that printing dots can be produced having a particular set of geometric characteristics that further contribute to superior printing performance. By using the oxygen barrier layers as described herein, dots are formed without the restricting effect of oxygen inhibition, resulting in flat tops and steep shoulder angles, the curing rate is controlled to the point that optimum reverse depths are maintained and should angles are not excessively broadened, and the resulting membrane lamination minimizes the creation of excessive surface roughness during thermal processing. These geometric parameters are described in more detail in related patent application Ser. No. 12/571,523 to Recchia and Ser. No. 12/660,451 to Recchia et al., the subject matter of each of which is herein incorporated by reference in its entirety.

In one embodiment, it is desirable that the relief printing dots have one or more characteristics selected from:
a) steep shoulder angles, wherein the shoulder angle of each of the plurality of dots is such that the overall shoulder angle is greater than about 50 degrees;
b) planarity of the dot surface, wherein the planarity of a top surface of the dots is such that the radius of curvature of the top surface of the dots, $r_t$, is greater than the total thickness of the at least one layer of photocurable material;
c) sufficient depth of relief between the dots, wherein the dot relief is greater than about 9% of the overall plate relief; and
d) sharpness of the edge at the point where the dot top transitions to the dot shoulder, wherein a ratio of $r_e$:p is less than 5%.

As discussed above, once formed, the screened film intermediate is placed on or brought into contact with the oxygen barrier layer on top of the photopolymerizable plate and the plate is exposed through the screen film intermediate and the oxygen barrier layer to UV radiation. The polymer material under the film dots remains unpolymerized.

Following exposure the plate is developed to remove the unpolymerized areas in the plate. As a result when processing is finished, the plate surface bears in the solid image areas a plurality of shallow cells having a typical depth of about 15 microns. Similarly, a number of halftone dots in the selected % dot sizes, similarly bear on their surface shallow cells. In one embodiment these cells are centered in the halftone dots. The depth of the ink cells in the half tone dots is controlled in the same manner as the depth of the ink cells in the solids. On the other hand, the halftone dots themselves, are processed to a depth which ideally approaches the plate floor. The halftone dot relief in every case is enough so that upon inking of the plate with the anilox roll, only the top surface area of the halftone dot and the ink cell, where there are ink cells, retain ink.

The plates thus formed are aligned and mounted on the printing cylinder and the cylinder is mounted on the press. Printing proceeds in the usual manner.

The inventors of the present invention have found that by using the process described herein, it is possible to achieve a higher maximum achievable solid ink density (SID) than has previously been possible by using screened film intermediates or oxygen barrier layers separately.

EXAMPLES

A print trial was conducted in which Digital MAX 0.06771.70 mm plates (available from MacDermid Printing Solutions) were imaged on an Esko Advance imager (available from EskoArtworks) with HIghRes optics and HD Flex 2.0 software package (available from EskoArtworks). An oxygen barrier membrane (Membrane 100, available from MacDermid Printing Solutions) was laminated to the Digital MAX plate using MacDermid Printing Solution's LUX laminator.

The test image incorporated 32 separate MicroCell patterns in 4×5 cm patches, along with a control solid patch with no screening applied. Plates were printed with 1320 stickyback, which is a standard choice fix hard digital plate.

The substrate printed was opaque White polyethylene, using Sun Chemical's solvent-based cyan ink on an Avanti 8 color CI press (available from PCMC). Anilox rolls (available from Harper Corp., Charlotte, N.C.) were used having 800 lines per inch (lpi) with a cell volume of 2.0 bcm (billion cubic microns per square inch) (cell volume refers to the ink carrying capacity of a cell multiplied by the number of cells in a given square inch of roll surface).

Readings of each screening condition were taken as averages of three separate print repeats, repeats collected after an X minute run-in period for each plate.

In order to evaluate the effect on solid ink density of various MicroCell patterns, 32 separate MicroCell patterns were print tested in order to allow for comparison of both an oxygen barrier membrane coated plate versus standard performance for a given MicroCell variant and to determine which variant offered the highest possible SID overall.

The standard Digital MAX plate solid produced a SID of 1.26, while the oxygen barrier membrane coated Digital. MAX plate gave a reading of 1.30. The 0.04 density difference is not statistically significant, nor is it large enough to be visually detectable. From this, it was concluded that the oxygen barrier membrane did not, by itself improve the SID of solid print performance of the Digital MAX plate.

Many MicroCell variants were found to have a significant effect on SID, but 11 of the 32 MicroCell patterns had lower SID than the control solid.

Of the remaining 21 patterns, 6 had SIDs that were statistically indistinguishable from the control. The remaining 15 patterns had SID significantly higher than the control, and four of them had SIDs over 1.50, which represents a greater than 20% increase in SID. The maximum SID obtained came from pattern MC16 at 1.61, which is a 28% increase over the control solid. This would be visibly striking to the naked eye.

Next, the effect of the oxygen barrier membrane on MicroCell performance was evaluated. The effect was dramatically and uniformly positive. There were 22 oxygen barrier membrane and MicroCell variants that showed significantly higher SID than the control solid. There were 7 oxygen barrier membrane and MicroCell variants that had SIDs lower than the control. Finally, there were only three variants in which the MicroCell and LUX combination was statistically insignificant from the control and there was only a single oxygen barrier membrane and MicroCell variant (MC15) where the oxygen barrier membrane did not improve the SID over the standard digital MicroCell and in this case, the standard and the oxygen barrier membrane version were statistically indistinguishable.

Even more impressively, the oxygen barrier membrane raised the maximum SID achievable from 1.61 to 1.76, which represents a 9% increase over the best SD achieved without the oxygen barrier membrane and a 35% SID increase compared to the control solid. Fully 9 of the MicroCell-oxygen barrier membrane variants gave a higher SID than the maximum achieved by the best MicroCell variant in standard digital plate format. In addition, four of the MicroCell variants that gave lower SID than the control in standard digital plates improved drastically, yielding much higher SID than the control once treated with the oxygen barrier membrane.

Thus it can be seen that not only did the oxygen barrier membrane improve the maximum SID possible, but it also increased the operating window for MicroCell, making more variants work than it did in standard digital format. In practice this could mean less testing would be required to find the best MicroCell pattern and to maintain the SID improvement that MicroCell offers the flexo printer.

| | Number of MicroCell Variants | |
|---|---|---|
| SID (relative to control solid) | Standard Digital | Oxygen Barrier Membrane Digital |
| Lower | 11 | 7 |
| Same | 6 | 3 |
| Higher | 15 | 22 |

Both solid and halftone areas in printed images that were printed with plates produced according to this invention exhibit higher density, better color uniformity and a reduction in halo around the edges of solids, than plates printed with the traditional smooth (no ink cells) area surface. In addition, the combination of the screened microcells with the use of the oxygen barrier membrane, improved ink lay-down and increased ink density on the final print.

It is also to be understood that the following claims are intended to cover all of the generic and specific features of the invention described herein and all statements of the scope of the invention which as a matter of language might fall therebetween.

What is claimed is:

1. A method of making a printing element comprising a plurality of relief dots, wherein the printing element comprises a backing layer having at least one photocurable layer disposed thereon and a laser ablatable masking layer on the at least one photocurable layer, the method comprising the steps of:
   a) selectively ablating the laser ablatable masking layer to create an overall image in the laser ablatable masking layer such that the overall image comprises a sub-image comprising a pattern of cells;

b) applying an oxygen barrier layer over the laser ablatable masking layer;

c) exposing the printing element to actinic radiation through the oxygen barrier layer and the laser ablatable masking layer to selectively crosslink and cure the at least one photocurable layer; and d) developing the printing element by removing the oxygen barrier layer and the uncured portions of the photocurable layer to reveal the relief dots;

wherein said cells are located on the relief dots.

2. The method according to claim 1, wherein the pattern comprises cylindrical, linear, or polygonal shapes.

3. The method according to claim 1, wherein the step of developing the printing element comprises a development method selected from the group consisting of water development, solvent development and thermal development.

4. The method according to claim 1, wherein the oxygen barrier layer is selected from the group consisting of polyamides, polyvinyl alcohol, hydroxyalkyl cellulose, polyvinyl pyrrolidinone, copolymers of ethylene and vinyl acetate, amphoteric interpolymers, cellulose acetate butyrate, alkyl cellulose, butyral, cyclic rubbers, and combinations of one or more of the foregoing.

5. The method according to claim 4, wherein the oxygen barrier layer comprises a clear film selected from the group consisting of polypropylene, polyethylene, polyvinyl chloride, polyester and combinations of one or more of the foregoing.

6. The method according to claim 5, wherein the oxygen barrier layer comprises a polypropylene film or a polyethylene terephthalate film.

7. The method according to claim 5, wherein the oxygen barrier layer has a thickness of between about 10 and 200 microns.

8. The method according to claim 5, wherein the oxygen barrier layer has a thickness of between about 1 and about 20 microns.

9. The method according to claim 1, wherein the oxygen barrier layer has an optical transparency of at least about 50%.

10. The method according to claim 9, wherein the oxygen barrier layer has an optical transparency of at least about 75%.

11. The method according to claim 1, wherein the oxygen barrier layer has an oxygen diffusion coefficient of less than $6.9 \times 10^{-9}$ m$^2$/sec.

12. The method according to claim 11, wherein the oxygen barrier layer has an oxygen diffusion coefficient of less than $6.9 \times 10^{-10}$ m$^2$/sec.

13. The method according to claim 12, wherein the oxygen barrier layer has an oxygen diffusion coefficient of less than $6.9 \times 10^{-11}$ m$^2$/sec.

14. The method according to claim 1, further comprising the steps of mounting the printing element on a printing cylinder and printing a substrate with the printing element.

* * * * *